United States Patent [19]
Görlach et al.

[11] Patent Number: 5,233,214
[45] Date of Patent: Aug. 3, 1993

[54] CONTROLLABLE, TEMPERATURE-COMPENSATED VOLTAGE LIMITER

[75] Inventors: Alfred Görlach; Horst Meinders, both of Reutlingen, Fed. Rep. of Germany

[73] Assignee: Robert Bosch GmbH, Stuttgart, Fed. Rep. of Germany

[21] Appl. No.: 776,270

[22] PCT Filed: Sep. 4, 1990

[86] PCT No.: PCT/DE90/00668
§ 371 Date: Nov. 27, 1991
§ 102(e) Date: Nov. 27, 1991

[87] PCT Pub. No.: WO91/04599
PCT Pub. Date: Apr. 4, 1991

[30] Foreign Application Priority Data

Sep. 14, 1989 [DE] Fed. Rep. of Germany ....... 3930697

[51] Int. Cl.$^5$ ............................................. H01L 29/90
[52] U.S. Cl. ................................. 257/469; 257/497; 257/498; 257/551; 257/570; 257/603; 257/606
[58] Field of Search .................... 357/13, 12, 28, 34, 357/35, 13 R, 13 Z, 13 PT; 257/551, 469, 199, 497, 498, 570, 603, 605, 606

[56] References Cited

U.S. PATENT DOCUMENTS

| | | | |
|---|---|---|---|
| 3,787,717 | 1/1974 | Fischer et al. | 317/235 R |
| 4,262,295 | 4/1981 | Okano et al. | 357/13 |
| 4,554,568 | 11/1985 | Champon et al. | 357/13 |
| 4,870,467 | 9/1989 | Boland et al. | 357/13 |
| 4,994,874 | 2/1991 | Shimizu et al. | 357/13 X |

FOREIGN PATENT DOCUMENTS

| | | |
|---|---|---|
| 2083487 | 12/1971 | France . |
| 2162365 | 7/1973 | France . |
| 55-12792 | 1/1980 | Japan ................................ 357/13 Z |
| 61-36979 | 2/1986 | Japan . |
| 61-187374 | 8/1986 | Japan . |
| 1344136 | 1/1974 | United Kingdom . |
| 1442838 | 7/1976 | United Kingdom . |

OTHER PUBLICATIONS de Cogan, "The Punch-Through Diode," *Microelectronics*, vol. 8, No. 2, 1977, pp. 20-23.
Goto, Patent Abstracts of Japan, vol. 10, No. 192 [E-417] [2248].
Hayashi, Patent Abstracts of Japan, vol. 11, No. 17 [E-471,2464].

*Primary Examiner*—William Mintel
*Attorney, Agent, or Firm*—Frishauf, Holtz, Goodman & Woodward

[57] ABSTRACT

The invention relates to a controllable, temperature-compensated voltage limiter with a $p^+np^+$ (or $n^+pn^+$) semiconductor structure in which the width and doping of the central zone is selected such that no avalanche or Zener effect appears when voltage is applied to the two outer layers (punch-through diode). In accordance with the invention, the voltage $U_B$ to be limited is applied between the blocking pn-juncture (B-C). In addition, an adjustable auxiliary voltage ($U_H$) is applied between the other pn-junction (H-C). The punch-through can be set to a higher defined value via the auxiliary voltage $U_H$, this value being independent of the temperature to a large extent.

9 Claims, 6 Drawing Sheets

CONTROLLABLE, TEMPERATURE-COMPENSATED VOLTAGE LIMITER

FIELD OF THE INVENTION

The invention relates to a controllable, temperature-compensated voltage limiter.

BACKGROUND

It is known to employ so-called punch-through diodes for temperature-controlled voltage reference or voltage limitation. Punch-through diodes are p+np+ or n+pn+semiconductor structures in which the width and doping of the central zone is selected such that no avalanche or Zener effect appears when voltage is applied to the two outer layers. If the voltage is increased, the space-charge region of the blocking pn-junction expands until it touches the pn-junction on the opposite side. This pn-junction operated in the on-state injects charge carriers into the field of the space-charge region, so that the current sharply increases starting at this voltage. At least with certain current densities, the current-voltage characteristic curve is practically independent of the temperature.

However, in connection with such punch-through diodes it is disadvantageous that the limiting voltage increases with the square of the width of the central highly resistive layer. Because of fluctuations in the penetration depth of the p-diffusion occurring during the manufacturing process it is difficult to specifically produce punch-through diodes with exactly defined breakdown values and to integrate them in particular for voltage limitation into planar transistors.

SUMMARY OF THE INVENTION

By means of the step in accordance with the invention, where the voltage to be limited is applied to the blocking pn-junction of the punch-through diode and additionally an adjustable auxiliary voltage is applied across the other pn-junction, it is achieved that the punch-through voltage can be increased corresponding to the auxiliary voltage. Based on the possibility of adjustment, it is possible to set defined breakdown values independent of the fluctuations of the penetration depth of the p-diffusion occurring during the manufacturing process. In this way such punch-through diodes, wired in accordance with the invention, are suitable for a plurality of uses in which temperature-compensated, exactly defined breakdown values are important. The invention can be employed with planar and non-planar components.

The required auxiliary voltage can be provided by an independent voltage source as well as by a settable or adjustable potentiometer.

The punch-through diode equipped in accordance with the invention can be integrated into transistors, particularly Darlington transistors, and thus is particularly suitable for the base-collector clamping in ignition transistors of an ignition system for motor vehicles.

BRIEF DESCRIPTION OF THE DRAWINGS

The invention will be described in detail by means of the drawings.

DETAILED DESCRIPTION

Figure 1:
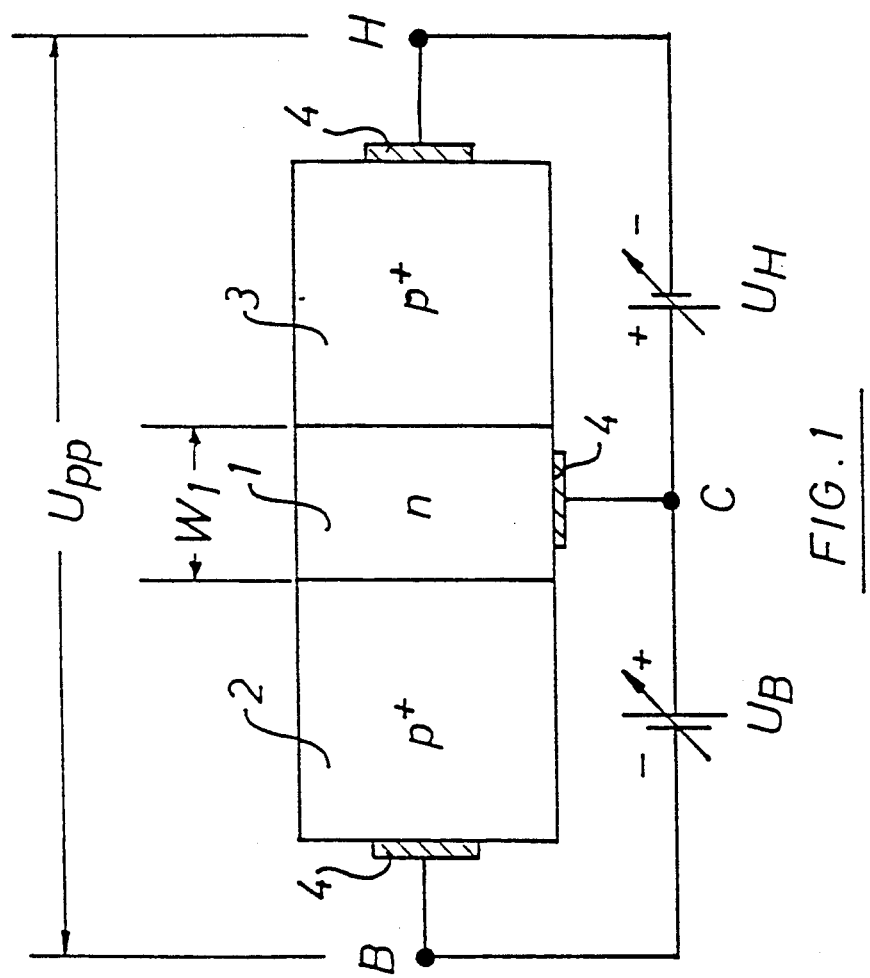
FIG. 1 is a representation in principle of a punch-through diode arrangement in the form of a p+np+p arrangement.

A p+np+ punch-through structure arrangement is shown in FIG. 1. Two p-zones 2, 3 have been diffused into an n-doped semiconductor crystal 1. The distance between the p-zones 2, 3 is W1. Doping of the zone 1 and the width W1 have been selected in such a way that no avalanche or Zener effect occurs. Each one of the three zones has contact with a metal coat 4 and has been provided with connectors, the connectors at the p-zones 2, 3 being indicated by B and H and the connector to the n-doped zone 1 being indicated by C.

The voltage $U_B$ to be limited is applied with the negative lead at B between the connectors B and C. Additionally, in accordance with the invention, a variable auxiliary voltage $U_H$ is applied between the connectors H and C with the negative lead at H.

$U_{pp} = U_B - U_H$ is true for the voltage $U_{pp}$ between the connectors B and H.

In the case of $U_H = 0$, the simple punch-through is present. It is possible to increase $U_B$ until the space-charge region of the left pn-junction touches the right p-zone. Because the right pn-junction is polarized in the flow direction, it is possible for leakage to flow from the connector H to the connector B (current flow). Therefore the voltage $U_B$ to be limited can only increase up to this set value.

In case the auxiliary voltage $U_H$ is not 0 but has a certain increased value, punch-through occurs at higher values of the voltage $U_B$ to be limited. The reason for this is that in the right p-n-junction, which prevents leakage injection, the field must first be compensated for by the larger and opposite field of the left pn-junction. Thus the application of the auxiliary voltage $U_H$ succeeds in increasing the punch-through voltage and to make it adjustable to a set value.

A voltage source for the auxiliary voltage $U_H$ is indicated in the arrangement in accordance with FIG. 1; however, the auxiliary voltage $U_H$ can also be generated by an adjustable potentiometer, as shown in the subsequent embodiments, so that no external auxiliary voltage source is required.

Figure 2:
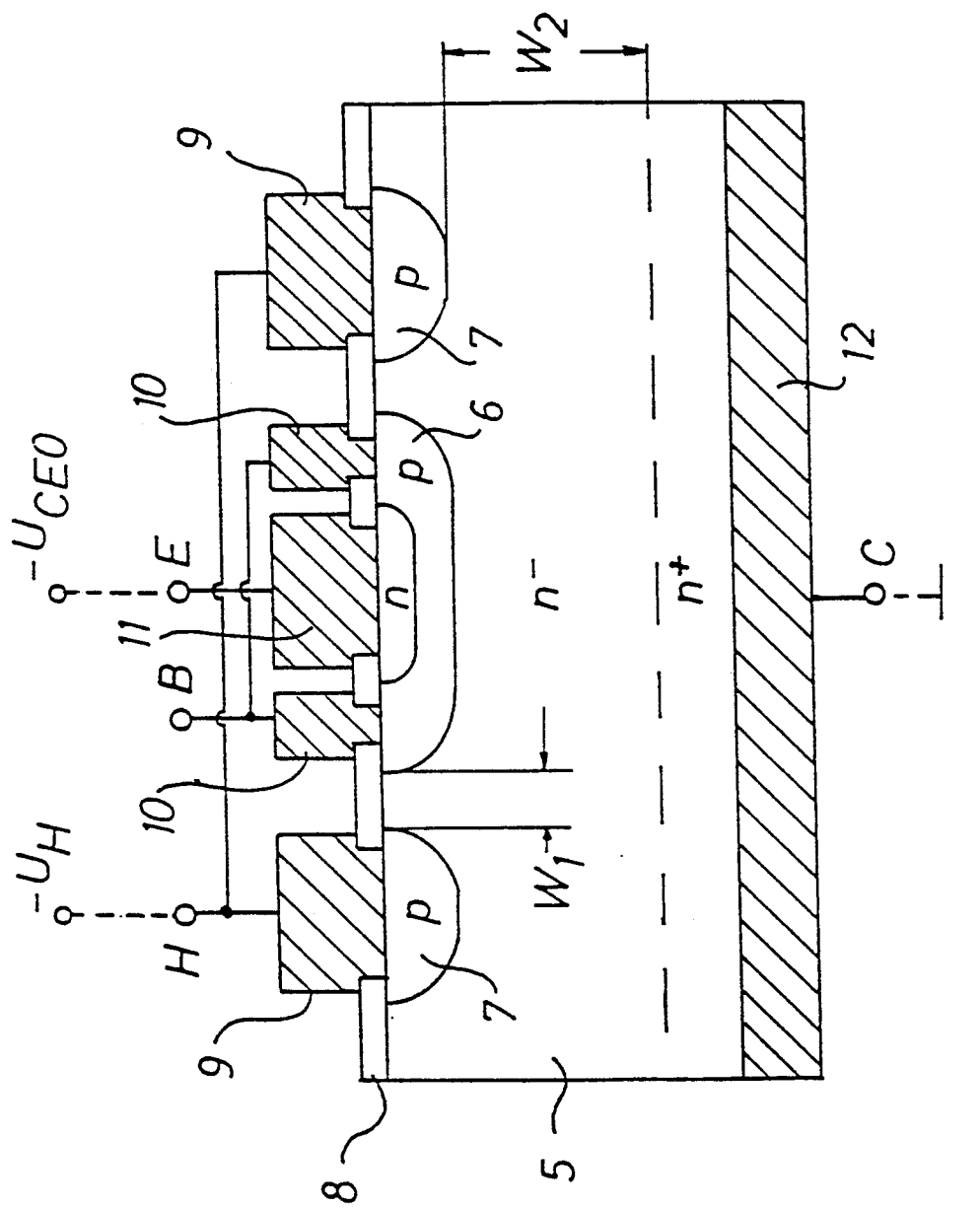
FIG. 2 is a representation where a punch-through diode is integrated with a p-ring into the base-collector path of a planar transistor for controllable voltage limitation.

Another modification of this type of adjustable voltage limitation is achieved by switching the punch-through diode between the base and the collector of a transistor. As an exemplary embodiment of this, FIG. 2 shows a planar arrangement in section.

In the above mentioned punch-through arrangement, two p-doped areas 6, 7, n- or n--doped, are located in an area 5. In this case the area 6 also is the base of an npn-transistor. The distance between the p-areas is W1 and the width of the collector zone of the transistor is W2. The blocking-state voltage $U_{CEO}$ of the transistor must be greater than the voltages to be limited by the punch-through effect.

Through openings of an oxide layer 8, the differently doped areas are in contact with metal coats 9, 10, 11 and on the back with a metal layer 12. The metal areas are indicated with H for connecting the auxiliary voltage, E (emitter), B (base), C (collector). It can be seen that the p-doped area 7 lies around the base area 6 in the shape of a ring at the distance W1. However, this is not absolutely necessary.

The transistor can be operated via the connectors E, B and C for the emitter, the base and the collector. It is additionally possible to generate an adjustable limiting voltage between the collector C and the emitter E with blocking-state polarity by applying an auxiliary voltage $U_H$ or via an adjustable potentiometer. In this case the negative pole of the auxiliary voltage $U_H$ is applied to the connector H in respect to the collector C (the negative pole of the blocking-state voltage $U_{CEO}$ is also applied to the emitter E).

The arrangement operates as described above in connection with FIG. 1 for the case of the punch-through diode: as soon as the punch-through voltage has been attained, current flows into the base B of the transistor and activates it. Subsequently the voltage is no longer increased.

Figure 3:
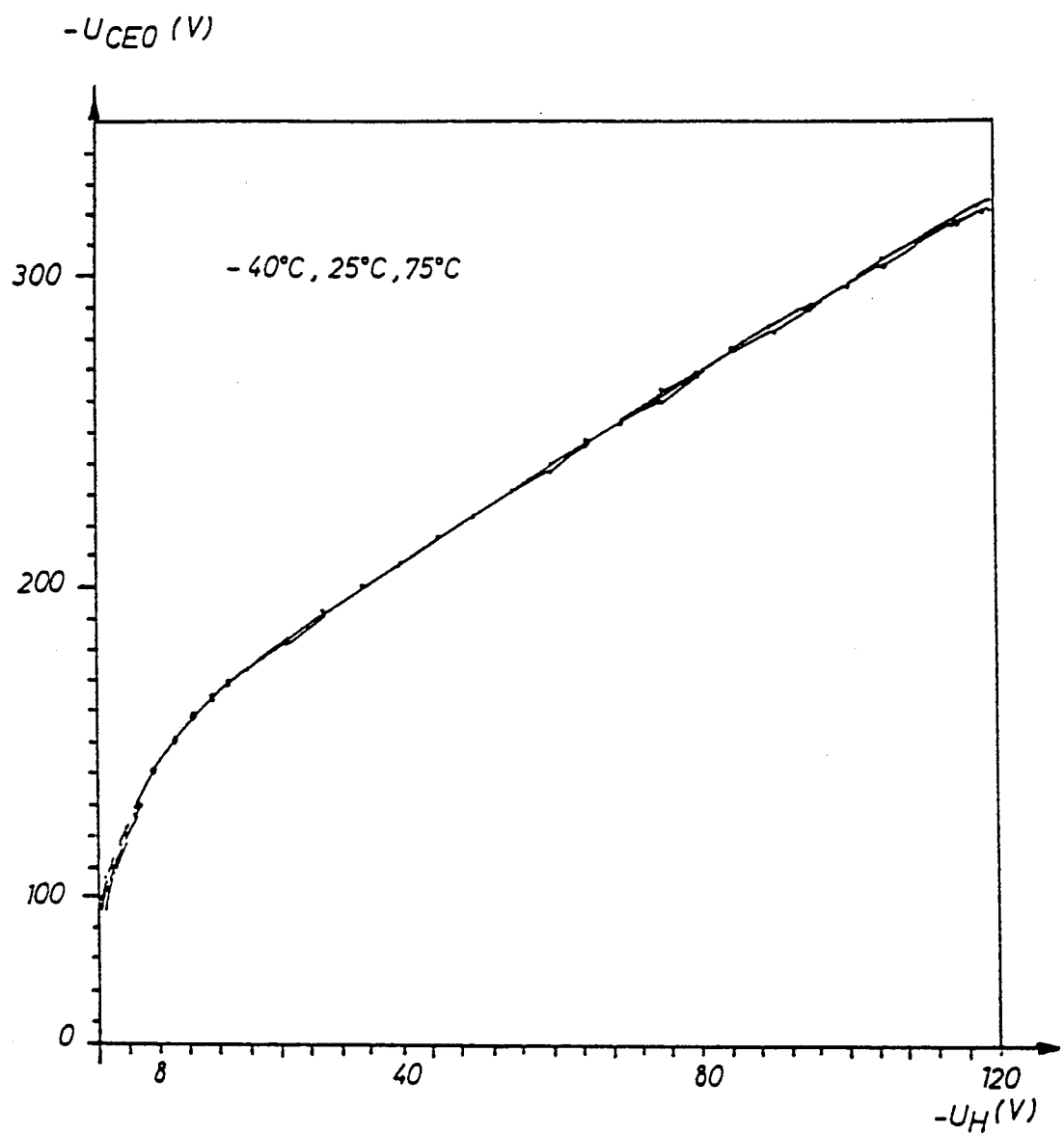
FIG. 3 is a diagram into which the blocking-state voltage $U_{CEO}$ has been entered as a function of the auxiliary voltage $U_H$ for a fixed current $I_C = 500$ µA of a test construction for temperatures $-40°$ C., $25°$ C. and $75°$ C.

In FIG. 3 the results of a measurement is shown, in which the blocking-state voltage $U_{CEO}$ has been applied as a function of the auxiliary voltage $U_H$ at three different temperatures (−40° C., 25° C., 75° C.) for a fixed blocking-state current (500 μA). The polarities and applied voltages for this measurement are shown by dashed lines in FIG. 2. In connection with this measurement the doping of the n⁻-semiconductor is approximately 7E13 cm⁻³, the distance on the surface approximately 28 μm.

It can be seen in FIG. 3 that the blocking-state voltage for all three temperatures is located to a large extent on a line, i.e. is independent of the temperature to a large degree. This shows that at certain current densities the punch-through voltage is for all practical purposes independent of the temperature and that this is also true if it has been increased by means of the auxiliary voltage $U_H$. The result thus is, in addition to the advantage of such an arrangement permitting setting of the blocking-state voltage, the large degree of independence of the blocking-state voltage from the temperature.

Figure 4:
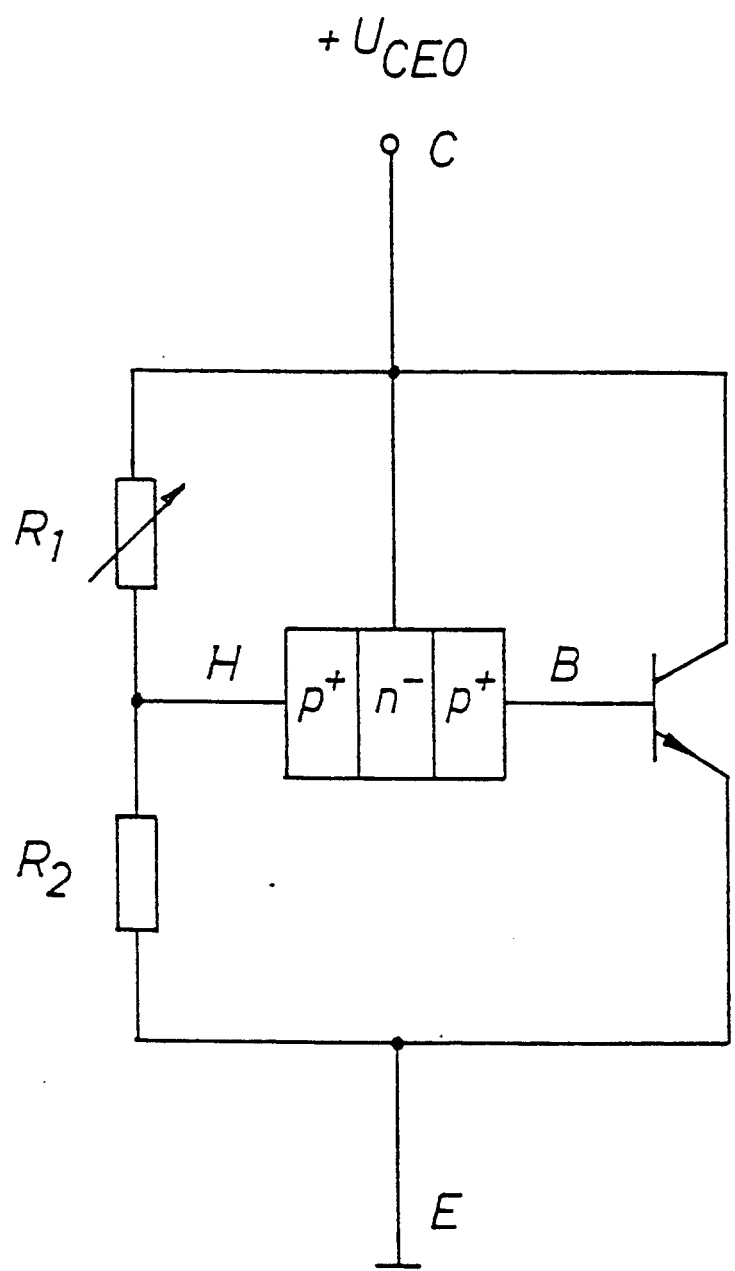
FIG. 4 is a circuit arrangement for generating an auxiliary voltage $U_H$ via a potentiometer.

A punch-through arrangement can again be seen in the center of FIG. 4, where the auxiliary voltage in accordance with the invention is generated via a potentiometer R1/R2, R1 being adjustable. Similar as in FIG. 2, the punch-through arrangement has been switched into the base-collector path of a transistor, corresponding transistor connections also being indicated with E (emitter), B (base), C (collector). Here, too, the connector for the auxiliary voltage is designated by H.

If a base-emitter resistor has been integrated into the transistor, it is also possible to make the connection of R2 on the emitter side with B (base) instead of E (emitter).

The blocking-state voltage $U_{CEO}$ of the transistor can be set with the aid of the adjustable resistor R1. If R1=0, this corresponds with the conventional punch-through. Increase of R1 also increases the punch-through voltage and thus the blocking-state voltage $U_{CEO}$.

Figure 5:
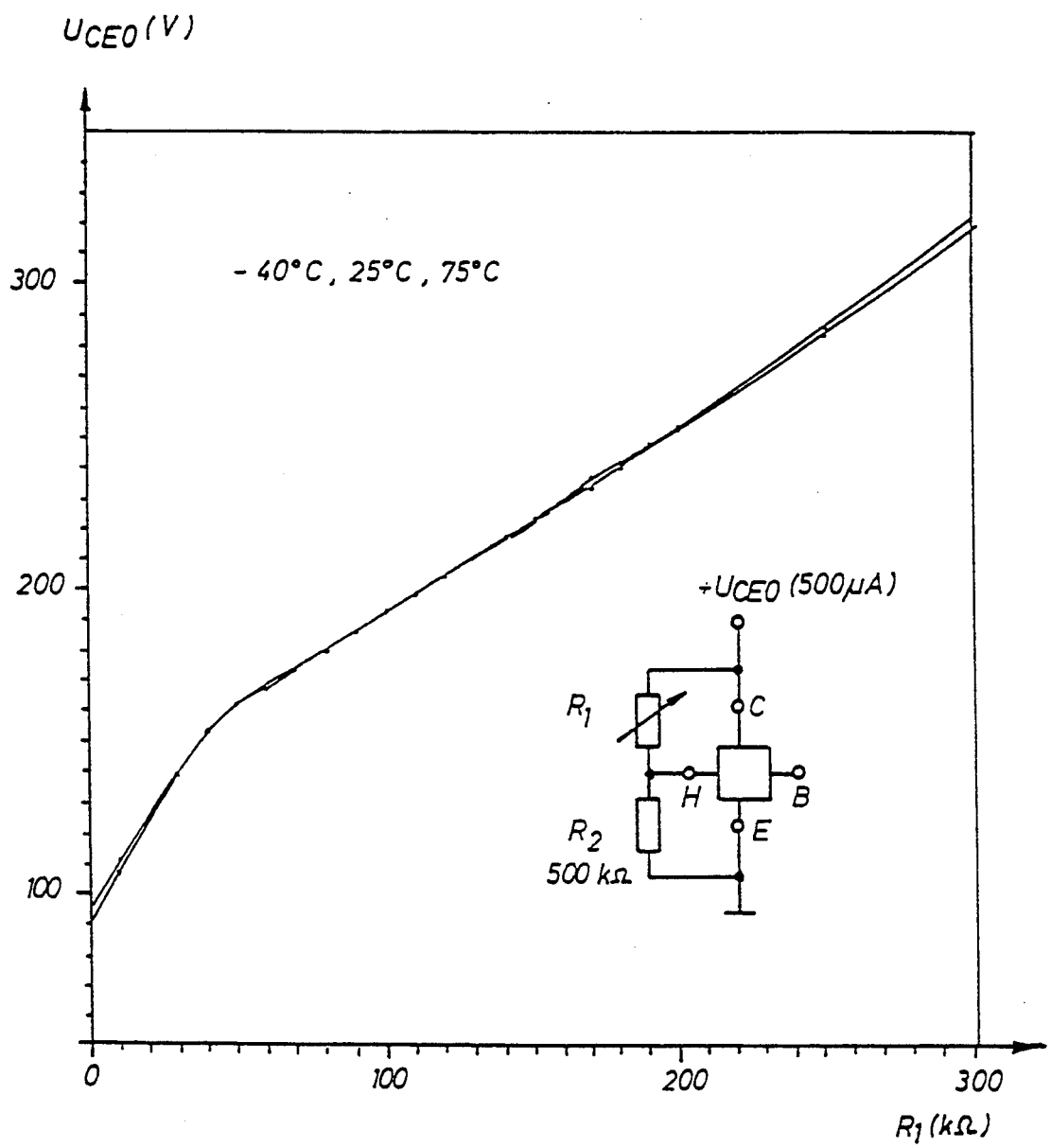
FIG. 5 is a diagram showing the blocking-state voltage $U_{CEO}$ as a function of the potentiometer resistance $R_1$ ($R_2 = 500$ kOhm) for temperatures $-40°$ C., $25°$ C. and $75°$ C.

By means of an example, the course of the blocking-state voltage $U_{CEO}$ as a function of the resistor R1 with a fixed resistor R2=500 kOhm is shown in FIG. 5. The corresponding measurement was also performed at three different, widely spread temperatures (−40° C., 25° C., 75° C.). In FIG. 5 it can also be seen that the set blocking-state voltage is independent of the temperature to a large degree.

If a planar, lateral punch-through diode arrangement such as in FIG. 2 is used, punch-through takes place at the semiconductor surface (boundary area between silicon/silicon oxide). In this case hot charge carriers can reach the silicon oxide and change the breakdown characteristic. For this reason it is advantageous to use such an arrangement where the punch-through does not take place at the semiconductor surface, but in the semiconductor body.

Figure 6:
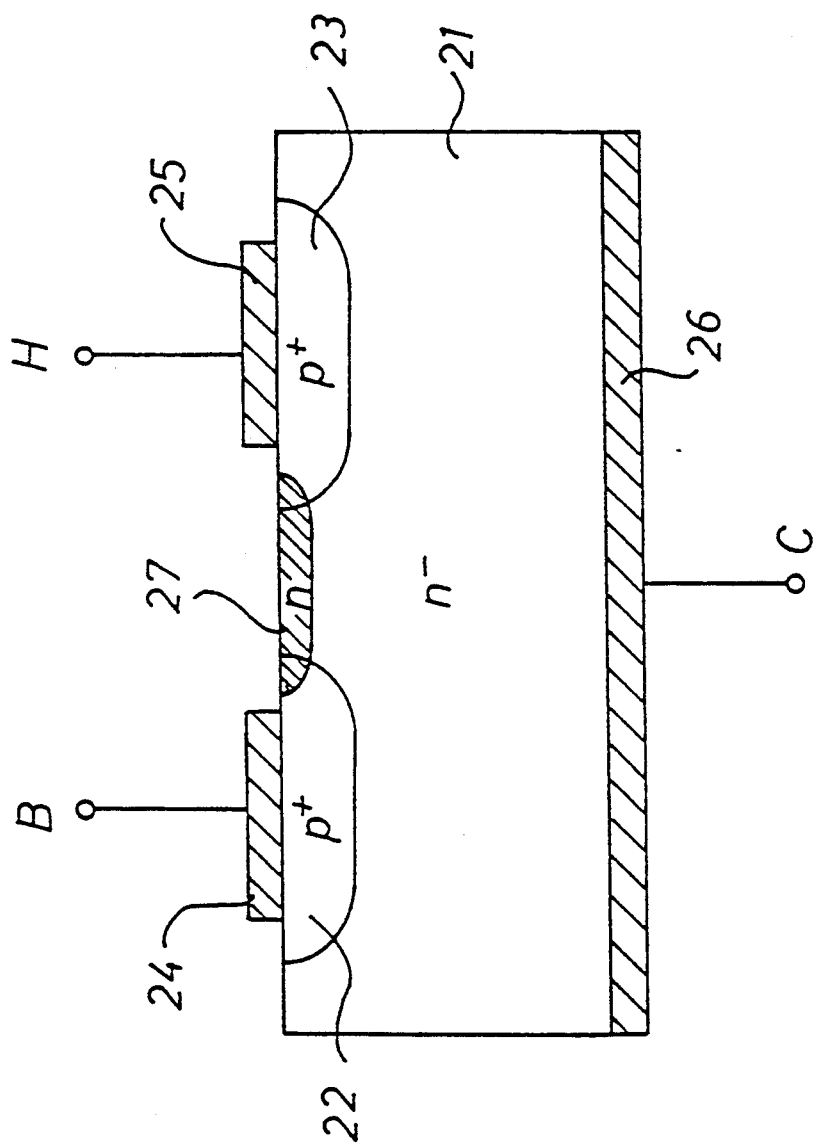
FIG. 6 is a sectional view through a punch-through diode arrangement for displacement of the punch-through zone into the depth of the semiconductor.

Such an arrangement is shown in a sectional view in FIG. 6. In this case the two p-doped areas 22, 23 needed for the punch-through have been diffused into an n⁻-doped semiconductor crystal 21. The differently doped semiconductor areas are connected with metal coats 24, 25 and 26. The connector indications H, B and C correspond to those of FIG. 1.

The area 27 additionally receives a weak n-doping on the surface where the punch-through takes place. Because, with the same voltage, the space charge zone expands less far in the higher doped n-area than in the n⁻ area 21, the punch-through voltage is higher in the area 27, i.e. the limiting voltage appears in the area 21. Thus the punch area is no longer located on the surface.

A displacement of the punch-through into the depth of the semiconductor is also achieved with a vertical p⁺np structure (analogous to the pnp transistor).

We claim:

1. A controllable, temperature-compensated punch-through voltage limiter, for limiting an applied voltage, the punch-through voltage limiter comprising:
   a three-layer doped semiconductor structure having a central layer and two outer layers arranged to form one of a p+np+ and n+pn+ type structure, a blocking pn-junction being formed between said central layer and one of said two outer layers, and a leakage injection preventing pn-junction being formed between said central layer and the other of said two outer layers;
   said central layer having a width and doping such that no avalanche and no Zener effect occurs when voltage is applied to said two outer layers;
   means for applying a voltage ($U_B$) across the blocking pn-junction; and
   means for applying a variable auxiliary voltage ($U_H$) across the leakage injection preventing pn-junction to variably set a limiting voltage value at which the applied voltage ($U_B$) is limited.

2. A controllable, temperature-compensated voltage limiter according to claim 1, wherein said semiconductor structure is arranged in a vertical punch-through manner, and wherein an area on the semiconductor surface where punch-through takes place has a weaker doping than other areas on the semiconductor surface, thereby displacing the punch-through into the semiconductor structure.

3. A controllable, temperature-compensated punch-through voltage limiter according to claim 1, wherein said means for applying said auxiliary voltage ($U_H$) includes an independent voltage source.

4. A controllable, temperature-compensated punch-through voltage limiter according to claim 1, wherein said means for applying said auxiliary voltage ($U_H$) includes an adjustable potentiometer (R1/R2) which is charged with the voltage to be limited and which is integrated with said semiconductor structure by means of planar technology.

5. A controllable, temperature-compensated punch-through voltage limiter according to claim 1, wherein a constant current source is provided for obtaining an adjustable voltage reference.

6. A controllable, temperature-compensated punch-through voltage limiter according to claim 1, wherein said semiconductor structure comprises a punch-through diode and is integrated with a Darlington transistor circuit.

7. A controllable, temperature-compensated punch-through voltage limiter according to claim 1, wherein said semiconductor structure comprises a punch-through diode and is integrated into a base-collector path of a transistor circuit by means of a p-ring.

8. A controllable, temperature-compensated voltage limiter according to claim 1, wherein said semiconductor structure is arranged in a planar, lateral punch-through manner, and wherein an area on a semiconductor surface where punch-through takes place has a weaker doping than other area on the semiconductor surface, thereby displacing the punch-through into an interior portion of the semiconductor structure.

9. A method of using a controllable, temperature-compensated punch-through voltage limiter for clamping voltage at a base-collector junction of an ignition transistor in an ignition circuit in an internal combustion engine, said punch-through voltage limiter having a three-layer doped semiconductor structure including a central layer and two outer layers arranged to form one of a p+pn+ and n+pn+ type structure, a blocking pn-junction being formed between said central layer and one of said two outer layers, and a leakage injection preventing pn-junction being formed between said central layer and the other of said two outer layers; said central layer having a width and doping such that no avalanche and no Zener effect occurs when voltage is applied to said two outer layers, said method comprising:

applying a clampable voltage ($U_B$) across the blocking pn-junction; and applying a variable auxiliary voltage ($U_H$) across the leakage injection preventing pn-junction to variably set a limiting voltage value at which the clampable voltage ($U_B$) is clamped.

* * * * *